United States Patent
Jeon et al.

(10) Patent No.: US 11,682,659 B2
(45) Date of Patent: Jun. 20, 2023

(54) DISPLAY DEVICE AND FABRICATING METHOD FOR DISPLAY DEVICE

(71) Applicant: Samsung Display Co., LTD., Yongin-si (KR)

(72) Inventors: Hyung Il Jeon, Yongin-si (KR); Min Woo Kim, Yongin-si (KR); Dae Ho Song, Yongin-si (KR); Jin Woo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 163 days.

(21) Appl. No.: 17/154,594

(22) Filed: Jan. 21, 2021

(65) Prior Publication Data
US 2021/0265322 A1    Aug. 26, 2021

(30) Foreign Application Priority Data

Feb. 21, 2020 (KR) .................. 10-2020-0021857

(51) Int. Cl.
*H01L 25/075* (2006.01)
*H01L 27/12* (2006.01)
(Continued)

(52) U.S. Cl.
CPC ...... *H01L 25/0753* (2013.01); *H01L 27/1214* (2013.01); *H01L 33/505* (2013.01);
(Continued)

(58) Field of Classification Search
CPC . H01L 33/64; H01L 25/0753; H01L 27/1214; H01L 33/505; H01L 33/60; H01L 33/641; H01L 33/642
See application file for complete search history.

(56) References Cited

U.S. PATENT DOCUMENTS 7,462,861 B2    12/2008    Slater, Jr. et al.
8,987,765 B2     3/2015    Bibl et al.
(Continued)

FOREIGN PATENT DOCUMENTS

KR    10-0654682    12/2006
KR    10-1130151     3/2012
(Continued)

OTHER PUBLICATIONS

Ying-Tsang Liu et al., "PixeLED Display for Transparent Applications", SID Symposium Digest of Technical Papers 49(1), May 2018, pp. 874-875.

(Continued)

*Primary Examiner* — Feifei Yeung Lopez
(74) *Attorney, Agent, or Firm* — Kile Park Reed & Houtteman PLLC

(57) ABSTRACT

A display device and a method of fabricating the same are disclosed, the display device includes a first metal layer on a substrate; light emitting elements emitting light of a first color, each of the light emitting elements having a first end contacting the first metal layer; an insulating layer disposed on the first metal layer and including holes exposing a second end of each of the light emitting elements facing the first metal layer; and a light conversion layer disposed in at least one of the holes and overlapping the light emitting elements. The light conversion layer converts the light of the first color emitted from the light emitting elements into light of a second color.

21 Claims, 12 Drawing Sheets

(51) Int. Cl.
*H01L 33/50* (2010.01)
*H01L 33/60* (2010.01)
*H01L 33/64* (2010.01)
*H01L 33/62* (2010.01)

(52) U.S. Cl.
CPC .............. *H01L 33/60* (2013.01); *H01L 33/62* (2013.01); *H01L 33/64* (2013.01); *H01L 33/641* (2013.01); *H01L 33/642* (2013.01); *H01L 2933/0041* (2013.01); *H01L 2933/0058* (2013.01); *H01L 2933/0066* (2013.01); *H01L 2933/0075* (2013.01)

(56) References Cited

U.S. PATENT DOCUMENTS

| | | |
|---|---|---|
| 9,159,700 B2 | 10/2015 | Sakariya et al. |
| 9,343,448 B2 | 5/2016 | Sakariya et al. |
| 10,133,426 B2 | 11/2018 | Boer et al. |
| 10,192,858 B2 | 1/2019 | Higginson et al. |
| 10,199,593 B2 | 2/2019 | Byun et al. |
| 10,224,460 B2 | 3/2019 | Bower et al. |
| 10,410,998 B2 | 9/2019 | Kim et al. |
| 2008/0035948 A1* | 2/2008 | Shin ............... H01L 24/29 257/E33.058 |
| 2017/0338212 A1* | 11/2017 | Kuo ............... H01L 25/167 |
| 2018/0233537 A1 | 8/2018 | Liu et al. |
| 2019/0074324 A1 | 3/2019 | Kim et al. |
| 2019/0198715 A1 | 6/2019 | Lim et al. |

FOREIGN PATENT DOCUMENTS

| | | |
|---|---|---|
| KR | 10-2018-0073971 | 7/2018 |
| KR | 10-2018-0093149 | 8/2018 |
| KR | 10-2019-0026440 | 3/2019 |
| KR | 10-2019-0076221 | 7/2019 |
| KR | 10-2019-0079147 | 7/2019 |

OTHER PUBLICATIONS

Hyo-Min Kim et al., "High Brightness Active Matrix Micro-LEDs with LTPS TFT Backplane", SID Symposium Digest of Technical Papers 49(1), May 2018, pp. 880-883.

* cited by examiner

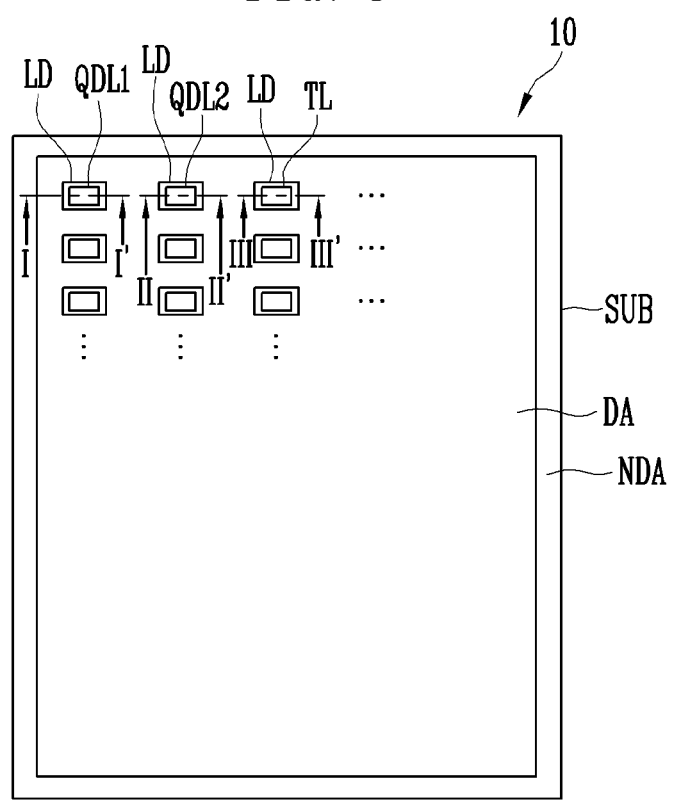

DISPLAY DEVICE AND FABRICATING METHOD FOR DISPLAY DEVICE

CROSS-REFERENCE TO RELATED APPLICATION(S)

This application claims priority to and benefits of Korean Patent Application No. 10-2020-0021857 under 35 U.S.C. § 119, filed on Feb. 21, 2020 in the Korean Intellectual Property Office, the entire contents of which are incorporated herein by reference.

BACKGROUND

1. Technical Field

Embodiments relate to a display device and a method of fabricating the same.

2. Description of the Related Art

A display device may display an image with a combination of lights emitted from pixels. In the display device, each pixel may include a pixel circuit and a light emitting element that may be controlled by the operation of the pixel circuit.

A light emitting diode (hereinafter, referred to as "LED") may have relatively satisfactory durability even under poor environmental conditions, and may have excellent performances in terms of lifetime and luminance. Recently, research on the technology of applying such LEDs to various display devices has become appreciably more active.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are directed to a display device having excellent resolution and a method of fabricating the display device.

An embodiment may provide a display device that may include a first metal layer disposed on a substrate; light emitting elements emitting light of a first color, each of the light emitting elements having a first end contacting the first metal layer; an insulating layer disposed on the first metal layer and comprising holes exposing a second end of each of the light emitting elements facing the first metal layer; and a light conversion layer disposed in at least one of the holes and overlapping the light emitting elements. The light conversion layer may convert the light of the first color emitted from the light emitting elements into light of a second color.

In an embodiment, the display device may further comprise a reflective layer disposed on an inner surface of each of the holes and exposing at least a portion of the second end of each of the light emitting elements.

In an embodiment, the reflective layer may contact a side surface of each of the light emitting elements.

In an embodiment, the display device may further comprise a transistor disposed on the insulating layer and electrically connected to each of the light emitting elements.

In an embodiment, an electrode of the transistor and the reflective layer may be integral with each other.

In an embodiment, the display device may further comprise a contact electrode electrically connecting the second end of each of the light emitting elements with the transistor.

In an embodiment, the contact electrode may be disposed between the light conversion layer and the reflective layer, and may be disposed between the light conversion layer and the second end of each of the light emitting elements.

In an embodiment, the contact electrode may be a transparent electrode.

In an embodiment, the display device may further comprise a color filter disposed on the light conversion layer and overlapping the light conversion layer.

In an embodiment, the display device may further comprise a light transmission layer disposed in the at least one of the holes and transmitting the light of the first color emitted from each of the light emitting elements.

In an embodiment, the substrate may comprise a display area and a non-display area adjacent to the display area, and a portion of the first metal layer overlapping the non-display area may be exposed as a heat dissipation layer.

In an embodiment, the display device may further comprise a second metal layer disposed between the first metal layer and the substrate.

In an embodiment, the first metal layer may be disposed on a portion of the second metal layer overlapping each of the light emitting elements.

The first end of each of the light emitting elements and the first metal layer may be eutectic bonded to each other.

An embodiment may provide a method of fabricating a display device that may include contacting a first end of each of light emitting elements emitting light of a first color with a first metal layer disposed on a substrate; forming an insulating layer overlapping the light emitting elements and the first metal layer; etching a portion of the insulating layer overlapping the light emitting elements to form holes exposing a second end of each of the light emitting elements facing the first metal layer; and forming a light conversion layer overlapping each of the light emitting elements in at least one of the holes. The light conversion layer may convert the light of the first color emitted from the light emitting elements into light of a second color.

In an embodiment, the contacting of the first end of each of the light emitting elements may comprise eutectic bonding the first end of each of the light emitting elements to the first metal layer.

In an embodiment, the method may further comprise forming a reflective layer on an inner surface of each of the holes.

In an embodiment, the method may further comprise forming a transistor electrically connected to each of the light emitting elements on the insulating layer, and integrally forming an electrode of the transistor and the reflective layer.

In an embodiment, the method may further comprise forming a light transmission layer in at least one of the holes, the light transmission layer transmitting the light of the first color emitted from each of the light emitting elements.

In an embodiment, the method may further comprise forming a contact electrode electrically connecting the second end of each of the light emitting elements with the transistor.

BRIEF DESCRIPTION OF THE DRAWINGS

The above and other embodiments and features of the disclosure will become more apparent by describing in detail embodiments thereof with reference to the attached drawings, in which:

FIG. 3 is a plan view schematically illustrating the display device in accordance with an embodiment.

DETAILED DESCRIPTION OF THE EMBODIMENTS

Figure 1:
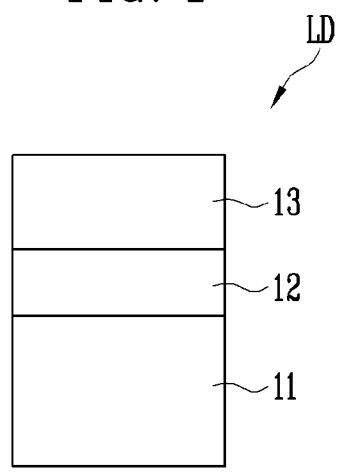
FIG. 1 is a diagram illustrating a structure of a light emitting element in accordance with an embodiment.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other layer, film, region, substrate, or area, or element, or intervening layers, films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, or elements may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as "not overlapping" or "to not overlap" another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments will hereinafter be described in detail with reference to the accompanying drawings.

FIG. 1 is a diagram illustrating a structure of a light emitting element in accordance with an embodiment.

Referring to FIG. 1, the light emitting element LD in accordance with an embodiment may be a vertical light emitting element formed by sequentially stacking a first semiconductor layer 11, an intermediate layer 12, and a second semiconductor layer 13.

The first semiconductor layer 11 may be implemented as a p-type semiconductor layer, for example. The p-type semiconductor layer may be selected from semiconductor materials having the composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN, and may be doped with a p-type dopant such as Mg, Zn, Ca, Sr, or Ba.

The second semiconductor layer 13 may be formed to contain an n-type semiconductor layer, for example. The n-type semiconductor layer may be selected from semiconductor materials having the composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN, and may be doped with an n-type dopant such as Si, Ge, or Sn.

However, the disclosure is not limited thereto. In other words, the first semiconductor layer 11 may comprise the n-type semiconductor layer, and the second semiconductor layer 13 may comprise the p-type semiconductor layer.

The intermediate layer 12 may be an area in which electrons and holes may be recombined. As the electrons and the holes are recombined, the intermediate layer 12 may be transferred to a low energy level and may generate light having a wavelength corresponding thereto. The intermediate layer 12 may be formed to contain a semiconductor material having the composition formula of $In_xAl_yGa_{1-x-y}N$ ($0 \leq x \leq 1$, $0 \leq y \leq 1$, $0 \leq x+y \leq 1$), for example. The intermediate layer 12 may be formed as a single quantum well structure or a multi quantum well (MQW) structure. A quantum wire structure or a quantum dot structure may be applicable to the intermediate layer 12.

Although FIG. 1 illustrates an example where the intermediate layer 12 is formed as the single quantum structure, the intermediate layer 12 may be formed as the multi quantum well (MQW) structure in an embodiment. In an embodiment, the intermediate layer 12 may be a multi-layered structure formed by alternately stacking active layers and insulating layers. In an embodiment, the active layer and the insulating layer may be formed with the same thickness or may be formed with different thicknesses (asymmetric quantum well (AQW)).

In an embodiment, the light emitting element LD may comprise an electrode (not illustrated) formed on each of the first and second semiconductor layers 11 and 13. For example, a first electrode (not illustrated) may be located or disposed on the first semiconductor layer 11, and a second electrode (not illustrated) may be located or disposed on the second semiconductor layer 13. The first or the second electrode may comprise a metal or a metal oxide. For example, chrome (Cr), titanium (Ti), aluminum (Al), gold (Au), nickel (Ni), and an oxide or alloy thereof and ITO (indium tin oxide) may be used alone or in combination with each other. However, the disclosure is not limited thereto.

In an embodiment, the light emitting element LD may comprise an insulating film (not illustrated). Such an insulating film may be omitted as illustrated in FIG. 1. The insulating film may be provided or disposed to enclose at least a portion or region of an outer circumferential surface of each of the first semiconductor layer 11, the intermediate layer 12, and the second semiconductor layer 13. For example, the insulating film may be provided or disposed on a portion or region of the light emitting element LD, other than the opposite ends thereof, so that the opposite ends of the light emitting element LD may be exposed. If the electrode is formed on each of the first and second semiconductor layers 11 and 13 of the light emitting element LD, the electrode formed or disposed on each of the first and second semiconductor layers 11 and 13 may be exposed by the insulating film.

The insulating film may comprise a transparent insulating material. For example, the insulating film may comprise at least one insulating material selected from the group consisting of $SiO_2$, $Si_3N_4$, $Al_2O_3$, and $TiO_2$, but it is not limited thereto. In other words, various materials having insulating properties may be employed.

Figure 2A:
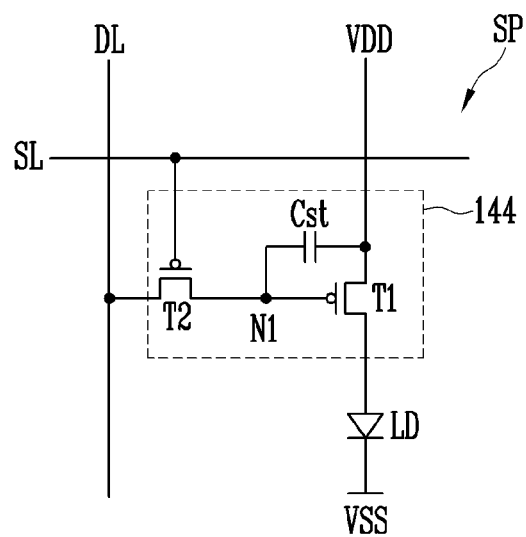
FIGS. 2A and 2B are each equivalent circuit diagrams illustrating a unit emission area of a display device in accordance with an embodiment.
Figure 2B:
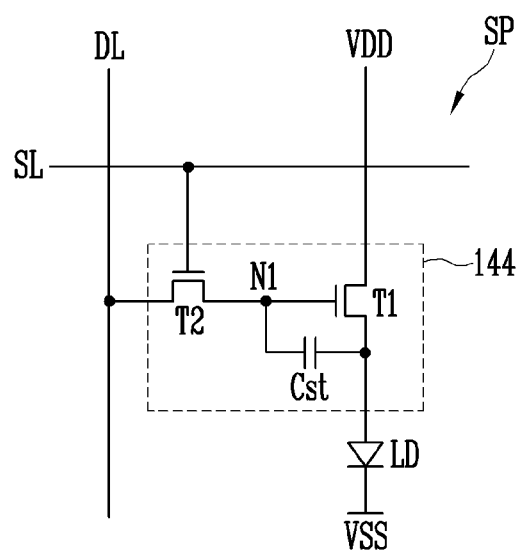

FIGS. 2A and 2B are each equivalent circuit diagrams illustrating a unit light-emission area of a display device in accordance with an embodiment.

FIGS. 2A and 2B illustrate examples of a pixel that may form an active light-emission display panel. In an embodiment, the unit light-emission area may be a pixel area in which a single sub-pixel may be provided or disposed.

Referring to FIG. 2A, a sub-pixel SP may comprise at least one light emitting element LD, and a pixel driving circuit 144 which may be electrically coupled or electrically connected to the light emitting element LD and may drive the light emitting element LD.

A second electrode (for example, an anode electrode) of the light emitting element LD may be electrically coupled or electrically connected to a first driving power supply VDD via the pixel driving circuit 144, and a first electrode (for example, a cathode electrode) of the light emitting element LD may be electrically coupled or electrically connected to a second driving power supply VSS.

The first driving power supply VDD and the second driving power supply VSS may have different potentials. For example, the second driving power supply VSS may have a potential lower than that of the first driving power supply VDD by a value about equal to or greater than a threshold voltage of the light emitting element LD.

Each of the light emitting elements LD may emit light at a luminance corresponding to driving current which may be controlled by the pixel driving circuit 144.

Although FIG. 2A illustrates an embodiment in which each of the sub-pixels SP comprises only one light emitting element LD, the disclosure is not limited thereto. For example, the sub-pixel SP may comprise light emitting elements LD that may be electrically coupled or electrically connected in parallel to each other.

In an embodiment, the pixel driving circuit 144 may comprise a first transistor T1, a second transistor T2, and a storage capacitor Cst. However, the structure of the pixel driving circuit 144 is not limited to an embodiment illustrated in FIG. 2A.

The first electrode of the first transistor T1 (driving transistor) may be electrically coupled or electrically connected to the first driving power supply VDD, and the second electrode thereof may be electrically coupled or electrically connected to the second electrode of each of the light emitting elements LD. A gate electrode of the first transistor T1 may be electrically coupled or electrically connected to a first node N1. Here, the first electrode and the second electrode of the first transistor T1 may be different electrodes. For example, if the first electrode of the first transistor T1 is a source electrode, the second electrode of the first transistor T1 may be a drain electrode. As such, the first transistor T1 may control the amount of driving current to be supplied to the light emitting elements LD in response to the voltage of the first node N1.

A first electrode of the second transistor (switching transistor) T2 may be electrically coupled or electrically connected to a data line DL, and a second electrode thereof may be electrically coupled or electrically connected to the first node N1. Here, the first electrode and the second electrode of the second transistor T2 may be different electrodes. For example, if the first electrode of the second transistor T2 is a source electrode, the second electrode of the second transistor T2 may be a drain electrode. A gate electrode of the second transistor T2 may be electrically coupled or electrically connected to a scan line SL.

In a case that a scan signal having a voltage level (for example, a low voltage level) that may turn on the second transistor T2 may be supplied from the scan line SL, the second transistor T2 may be turned on to electrically couple or connect the data line DL with the first node N1. Here, a data signal of a corresponding frame may be supplied to the data line DL, so that the data signal may be transmitted to the first node N1. A voltage corresponding to the data signal transmitted to the first node N1 may be charged in the storage capacitor Cst.

One electrode of the storage capacitor Cst may be electrically coupled or electrically connected to the first driving power supply VDD, and the other electrode thereof may be electrically coupled or electrically connected to the first node N1. The storage capacitor Cst may charge a voltage corresponding to the data signal supplied to the first node N1, and may maintain the charged voltage until a data signal of a subsequent frame may be supplied.

For ease of explanation, FIG. 2A illustrates the pixel driving circuit 144 having a relatively simple structure comprising the second transistor T2 that may transmit the data signal to the sub-pixel SP, the storage capacitor Cst that may store the data signal, and the first transistor T1 that may supply driving current corresponding to the data signal to the light emitting element LD.

However, the disclosure is not limited thereto, and the structure of the pixel driving circuit 144 may be changed in various ways. For example, the pixel driving circuit 144 may comprise at least one transistor element such as a transistor element that may compensate for the threshold voltage of the first transistor T1, a transistor element that may initialize the first node N1, and/or a transistor element that may control a light-emission time of the light emitting elements LD, or other circuit elements such as a boosting capacitor that may boost the voltage of the first node N1.

Although in FIG. 2A the transistors, for example, the first and second transistors T1 and T2, comprised in the pixel driving circuit 144 have been illustrated as being formed of P-type transistors, the disclosure is not limited to this. In other words, at least one of the first and second transistors T1 and T2 comprised in the pixel driving circuit 144 may be changed to an N-type transistor.

Referring to FIG. 2B, in an embodiment, the first and second transistors T1 and T2 may be implemented as N-type transistors. The configuration and operation of the pixel driving circuit 144 illustrated in FIG. 2B, other than a change in connection positions of some or a predetermined number of components due to a change in the type of transistor, may be similar to those of the pixel driving circuit 144 of FIG. 2A. Therefore, detailed descriptions pertaining to this will be omitted.

FIG. 3 is a plan view schematically illustrating the display device in accordance with an embodiment. By way of example, FIG. 3 is a schematic plan view illustrating the display device may use the light emitting element illustrated in FIG. 1 as a light source.

Referring to FIGS. 1 and 3, the display device 10 in accordance with an embodiment may comprise a substrate SUB, a light emitting element LD provided or disposed on the substrate SUB, light conversion layers QDL1 and QDL2, and a light transmission layer TL.

The display device 10 may be classified into a passive-matrix type display device and an active-matrix type display device according to a method of driving the light emitting element LD. For example, in the case where the display device 10 is implemented as the active-matrix type, each of the pixels may comprise a driving transistor that may control the amount of current to be supplied to the light emitting element LD, and a switching transistor that may transmit data signals to the driving transistor.

Recently, active-matrix type display devices that may be capable of selectively turning on each pixel taking into account the resolution, the contrast, and the working speed have been mainstreamed. However, the disclosure is not limited thereto. For example, passive-matrix type display devices in which pixels may be turned on by groups may also employ components (for example, first and second electrodes) that may drive the light emitting element LD.

The substrate SUB may comprise a display area DA and a non-display area NDA. The display area DA may be an area in which pixels displaying an image may be provided or disposed, and may be referred to as an active area. In various embodiments, each of the pixels may comprise at least one light emitting element LD. The light emitting element LD may be an organic light emitting diode or a small-sized inorganic light emitting diode having a micro- or nano-scale size, but the disclosure is not limited thereto. The display device 10 may drive pixels in response to image data input from an external device, thus displaying an image on the display area DA.

The non-display area NDA may be an area which may be located or disposed around or adjacent to the display area DA, and may be referred to as a non-active area. In various embodiments, the non-display area NDA may comprehensively mean areas other than the display area DA on the substrate SUB. As illustrated in FIG. 3, the non-display area NDA may enclose the display area DA.

The non-display area NDA may be an area in which the driver that may drive the pixels and a portion or region of a line component that may couple or electrically connect the pixels to the driver may be provided or disposed.

The pixels may be provided or disposed in the display area DA on the substrate SUB. Each of the pixels may refer to a unit that may display an image, and pixels may be provided or disposed. Each of the pixels may comprise a light emitting element LD which may emit white light and/or color light. Each pixel may emit light having any one color among red, green, and blue, and it is not limited thereto. For example, each pixel may emit light having any one color among cyan, magenta, yellow, and white.

Pixels may be provided or disposed. The pixels may be arranged or disposed in the shape of a matrix along a column extending in a first direction and a row extending in a second direction that may cross or intersect the first direction. However, the arrangement of the pixels is not limited to a particular arrangement. In other words, the pixels may be arranged or disposed in various forms.

The driver may provide a signal to each pixel through the line component, thus controlling the driving of the pixel. In FIG. 3, the line component is omitted for the sake of explanation.

The drivers may comprise a scan driver (not illustrated) that may provide scan signals to the pixels through scan lines, an emission driver (not illustrated) that may provide emission control signals to the pixels through emission control lines, a data driver (not illustrated) that may provide data signals to the pixels through data lines, and a timing controller (not illustrated). The timing controller may control the scan driver, the emission driver, and the data driver.

The display device 10 in accordance with an embodiment may be employed in various electronic devices. For instance, the display device 10 may be applied to a television, a notebook computer, a cellular phone, a smartphone, a smartpad (PD), a portable multimedia player (PMP), a personal digital assistant (PDA), a navigation device, various kinds of wearable devices such as a smartwatch, for example, within the spirit and the scope of the disclosure.

Figure 4A:
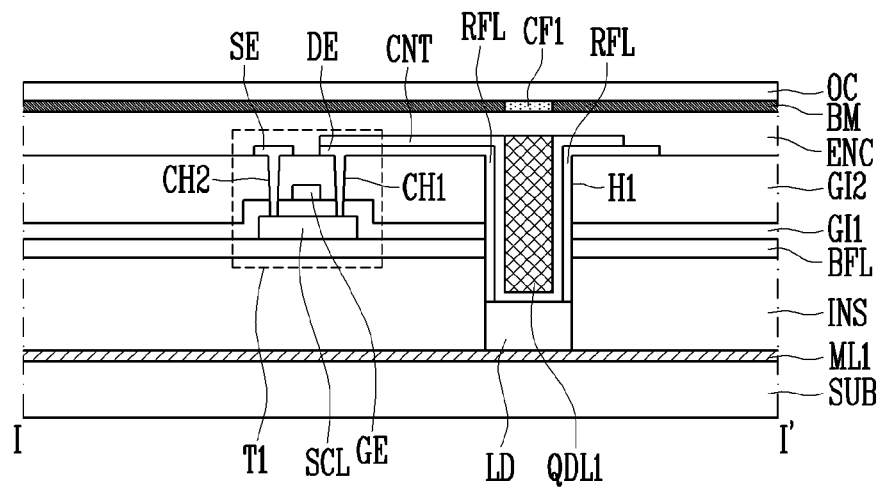
FIGS. 4A and 4B are schematic cross-sectional views taken along line I-I' of FIG. 3.
Figure 4B:
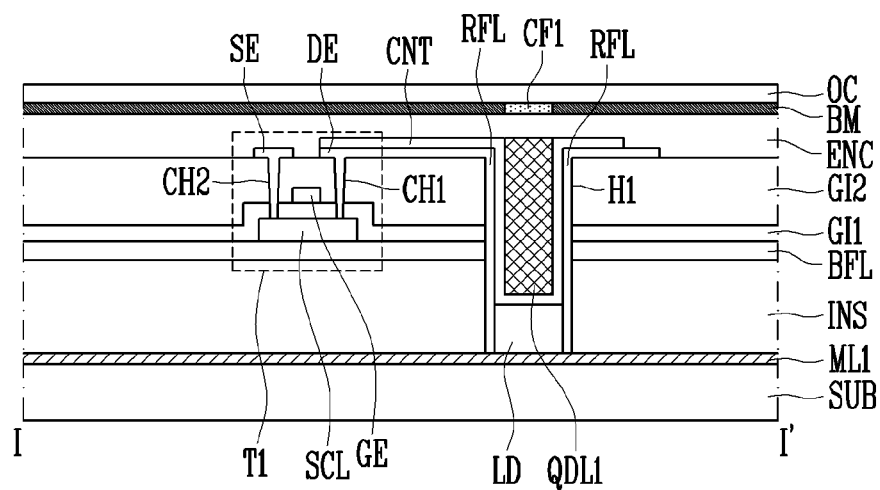
Figure 5:
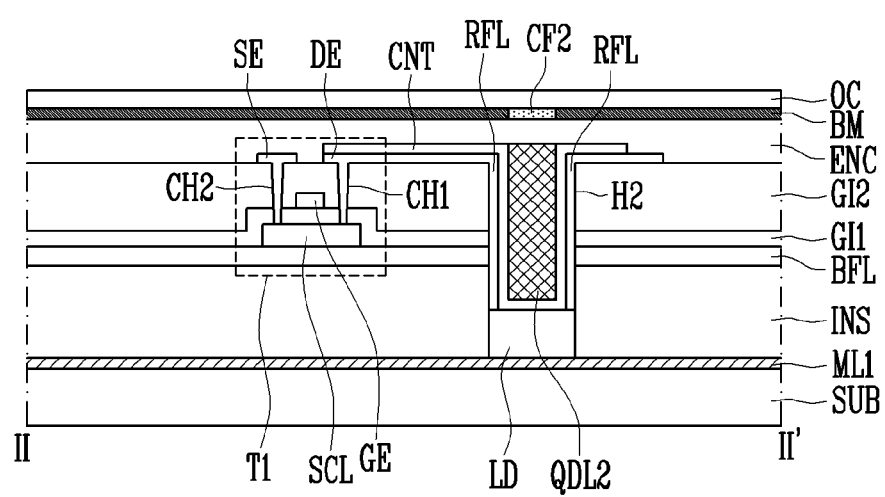
FIG. 5 is a schematic cross-sectional view taken along line II-IF of FIG. 3.
Figure 6:
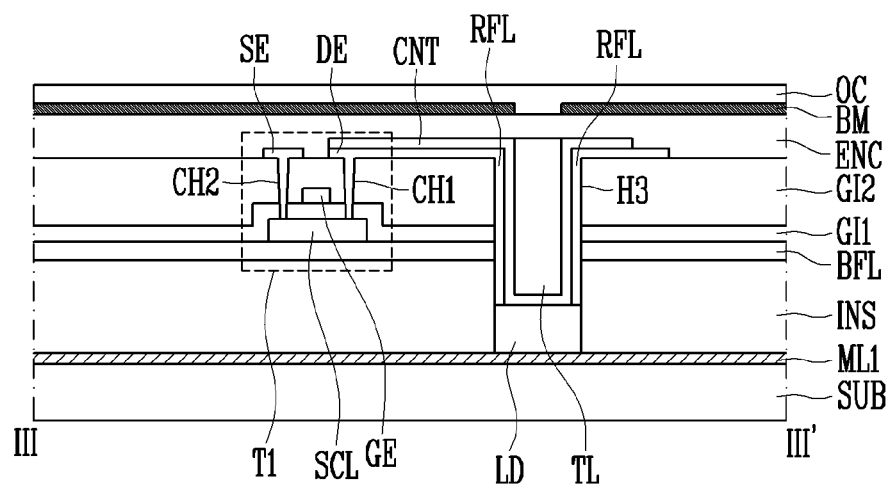
FIG. 6 is a schematic cross-sectional view taken along line of FIG. 3.

FIGS. 4A and 4B are schematic cross-sectional views taken along line I-I' of FIG. 3, FIG. 5 is a schematic cross-sectional view taken along line II-IF of FIG. 3, and FIG. 6 is a schematic cross-sectional view taken along line of FIG. 3. For the convenience of description, a second transistor comprised in the display device is not separately illustrated in FIGS. 4A to 6.

As illustrated in FIGS. 3 to 6, the display device 10 in accordance with an embodiment may comprise a substrate SUB, a first metal layer ML1, an insulating layer INS, light emitting elements LD, light conversion layers QDL1 and QDL2, and a light transmission layer TL.

The substrate SUB may be a rigid substrate or a flexible substrate.

Examples of the rigid substrate may comprise a glass substrate, a quartz substrate, a glass ceramic substrate, and/or a crystalline glass substrate.

Examples of the flexible substrate may comprise a film substrate and a plastic substrate, each of which may comprise polymer organic material. For example, the flexible substrate may comprise one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). The flexible substrate may comprise fiber glass reinforced plastic (FRP).

A material applied to the substrate SUB may have resistance (thermal resistance) to high treatment temperatures during a process of fabricating the display device 10. In an embodiment, the entirety or at least a portion or region of the substrate SUB may have flexibility.

Referring to FIGS. 4A to 6, the first metal layer ML1 may be located or disposed on a surface of the substrate SUB. The first metal layer ML1 may comprise a conductive material having a high light reflectivity. The conductive material having the high light reflectivity may comprise metal, for example, Ag, Mg, Al, Pt, Pd, Au, Ni, Nd, Ir, Cr, Ti, and/or an alloy thereof.

The first metal layer ML1 may be provided or disposed on all or some or a predetermined number of areas of the substrate SUB. For example, the first metal layer ML1 may be provided or disposed on some or a predetermined number of areas of the substrate SUB overlapping each of the light emitting elements LD.

The light emitting elements LD may be located or disposed on the first metal layer ML1 and may emit light of a first color. For example, the light emitting elements LD may emit white light or blue light. Hereinafter, an embodiment in which the light emitting elements LD emit the blue light will be described. However, the color of light emitted from the light emitting elements LD is not limited thereto.

A first end of each of the light emitting elements LD may contact the first metal layer ML1. Thereby, a second end of the light emitting element LD that may be opposite to the first end may face the first metal layer ML1. For example, the light emitting element LD may be a vertical light emitting element, and may be located or disposed in an erected state on the first metal layer ML1.

A first electrode (not illustrated) may be provided or disposed on the first end of the light emitting element LD, and a second electrode (not illustrated) may be provided or disposed on the second end thereof. The first electrode of the light emitting element LD may contact the first metal layer ML1, and the second electrode of the light emitting element LD may not contact the first metal layer ML1. In other words, the first and second electrodes of the light emitting element LD may be located or disposed on different planes. It may be easy to realize the display device 10 of high resolution, by making only the first end of the light emitting element LD in contact with the first metal layer ML1.

In an embodiment, the first end of each of the light emitting elements LD and the first metal layer ML1 may be eutectic bonded. For example, the first electrode located or disposed on the first end of each of the light emitting elements LD and the first metal layer ML1 may be eutectic bonded. Here, the metal used for eutectic bonding may maintain a stable state at a process temperature of the transistor. For example, the metal used for the eutectic bonding may be made of Au, Cu, Sn, Ag, Al, Pt, Ti, Ni, Cr or mixtures thereof.

The light emitting elements LD may be stably secured to the first metal layer ML1, by eutectic bonding the first end of each of the light emitting elements LD to the first metal layer ML1. As the light emitting element LD may be eutectic bonded to the first metal layer ML1 before manufacturing a transistor, the light emitting elements LD may form a more stable electric connection between transistors. Thereby, the light emitting efficiency of the light emitting elements LD may be improved.

As illustrated in FIGS. 4A to 6, the insulating layer INS may be provided or disposed on the first metal layer ML1, and may comprise holes H1, H2, and H3 that may expose the second end of each of the light emitting elements LD. The insulating layer INS may expose the second end of each of the light emitting elements LD through the holes H1, H2, and H3, and may cover or overlap the first metal layer ML1.

The insulating layer INS may be provided or disposed in the form of an organic insulating film or layer, or an inorganic insulating film or layer. Here, the inorganic insulating film or layer may comprise at least one of silicon oxide $SiO_x$, silicon nitride $SiN_x$, silicon oxynitride SiON, and/or metal oxide such as $AlO_x$.

The organic insulating film or layer may comprise an organic insulating material. The organic insulating film or layer may comprise, for example, at least one of polyacrylates resin, epoxy resin, phenolic resin, polyamides resin, polyimides resin, unsaturated polyesters resin, poly-phenylene ethers resin, poly-phenylene sulfides resin, and/or benzocyclobutene resin.

In an embodiment, the insulating layer INS may comprise at least polyimides resin. The polyimides resin has advantages in that it retains high heat resistance to allow a process to be performed even at about 400° C. or higher, and may easily increase the thickness of the insulating layer INS. The polyimides resin may form a fine hole, pattern and the like through an etching process, so that it may be possible to realize a more precise design structure.

In an embodiment, the insulating layer INS may be formed of an inorganic insulating layer that may be advantageous to protect the light emitting element LD from the first transistor T1. However, the disclosure is not limited thereto. In an embodiment, the insulating layer INS may be formed of the organic insulating layer that may be advantageous to planarize a buffer layer BFL.

Additional insulating layers and the transistors T1 and T2 (see FIGS. 2A and 2B) may be provided or disposed on the insulating layer INS. The additional insulating layers may comprise a buffer layer BFL, a first gate insulating film GI1, a second gate insulating film GI2, and an encapsulation layer ENC.

The buffer layer BFL may be provided or disposed on the insulating layer INS. The buffer layer BFL may prevent impurities from being diffused into the first and second transistors T1 and T2 (see FIGS. 2A and 2B). The buffer layer BFL may comprise an inorganic insulating film containing an inorganic material. For example, the buffer layer BFL may comprise at least one of metal oxides such as silicon nitride ($SiN_x$), silicon oxide ($SiO_x$), silicon oxynitride (SiON), and/or $AlO_x$.

The buffer layer BFL may comprise holes H1, H2, and H3 corresponding to the holes H1, H2, and H3 formed in the insulating layer INS. The buffer layer BFL may be provided or disposed in a single layer structure or a multilayer structure having at least two or more layers. In the case where the buffer layer BFL has the multilayer structure, the respective layers may be formed of the same or similar material or different materials. The buffer layer BFL may be omitted depending on the material of the substrate SUB or processing conditions.

The first transistor T1 may be a driving transistor which may be electrically coupled or electrically connected to the light emitting element LD to drive the light emitting element LD. The second transistor T2 (see FIGS. 2A and 2B) may be a switching transistor which may be electrically coupled or electrically connected to the first transistor T1 to switch the first transistor T1.

Each of the first and second transistors T1 and T2 may comprise a semiconductor layer SCL, a gate electrode GE, a source electrode SE, and a drain electrode DE.

The semiconductor layer SCL of the transistors T1 and T2 may be provided or disposed on the buffer layer BFL. The semiconductor layer SCL may comprise a source area and a drain area which may respectively electrically contact the corresponding source electrode SE and the corresponding drain electrode DE. An area between the source area and the drain area may be a channel area. The semiconductor layer SCL may be a semiconductor pattern formed of polysilicon, amorphous silicon, an oxide semiconductor, for example, within the spirit and the scope of the disclosure. The channel area may be a semiconductor pattern doped with an impurity. The impurity may be an impurity such as an n-type impurity, a p-type impurity or other metals.

The gate electrode GE of the transistors T1 and T2 may be provided or disposed on the corresponding semiconductor layer SCL with a first gate insulating film GI1 interposed therebetween.

The drain electrode DE comprised in the first transistor T1 may be coupled or electrically connected to the drain area of the corresponding semiconductor layer SCL through a first contact hole CH1 formed through the second gate insulating film GI2 and the first gate insulating film GI1. The source electrode SE comprised in the first transistor T1 may be coupled or electrically connected to the source area of the corresponding semiconductor layer SCL through a second contact hole CH2 formed through the second gate insulating film GI2 and the first gate insulating film GI1.

The source electrode SE and the drain electrode DE comprised in the second transistor T2 may be respectively coupled or electrically connected to the source area and the drain area of the corresponding semiconductor layer SCL through the contact holes formed through the second gate insulating film GI2 and the first gate insulating film GI1.

FIGS. 4A to 6 illustrate the case where the transistors T1 and T2 may be a thin film transistor having a top gate structure, but the disclosure is not limited thereto. According to an embodiment, the transistors T1 and T2 may be a thin film transistor having a bottom gate structure.

The first and second gate insulating films GI1 and GI2 may comprise holes H1, H2, and H3 corresponding to the holes H1, H2, and H3 formed in the insulating layer INS. In other words, the holes H1, H2, and H3 may be formed through the insulating layer INS, the buffer layer BFL, and the first and second gate insulating films GI1 and GI2.

In an embodiment, the display device 10 may comprise light conversion layers QDL1 and QDL2 that may be located or disposed in an internal space of at least one of the holes H1, H2, and H3 and may overlap each of the light emitting elements LD. The light conversion layers QDL1 and QDL2 may convert the light of the first color emitted from each of the light emitting elements LD into the light of the second color. The light of the second color may be light having a wavelength that may be different from that of the first color. For example, the light of the second color and the light of the first color may have different colors.

In an embodiment, the light conversion layers QDL1 and QDL2 may comprise wavelength conversion particles that may convert the wavelength of incident light. The wavelength conversion particles may be, for example, a quantum dot (QD), a fluorescent material, or a phosphorescent material. The wavelength conversion particle is not limited to a specific type. Hereinafter, for the convenience of description, a case in which the wavelength conversion particle is the quantum dot will be described.

As illustrated in FIG. 4A, the first light conversion layer QDL1 may be located or disposed in the internal space of the first hole H1. The first light conversion layer QDL1 may be provided or disposed to overlap the light emitting element LD. The light of the first color emitted from the light emitting element LD may be converted into the light of the second color in the first light conversion layer QDL1. For instance, in a case that the blue light is emitted from the light emitting element LD, the first light conversion layer QDL1 may convert the blue light into the red light. However, the color of the light converted by the first light conversion layer QDL1 is not limited. For instance, the blue light emitted from the light emitting element LD may be converted into green light in the first light conversion layer QDL1. In a case that white light is emitted from the light emitting element LD, the first light conversion layer QDL1 may convert incident light into light having any one of red, green, and blue colors.

As illustrated in FIG. 5, the second light conversion layer QDL2 may be located or disposed in the internal space of the second hole H2. The second light conversion layer QDL2 may be provided or disposed to overlap the light emitting element LD. The light of the first color emitted from the light emitting element LD may be converted into the light of the second color in the second light conversion layer QDL2. For instance, in a case that the blue light is emitted from the light emitting element LD, the second light conversion layer QDL2 may convert the blue light into the green light. However, the color of the light converted by the second light conversion layer QDL2 is not limited thereto. For instance, the blue light emitted from the light emitting element LD may be converted into red light in the second light conversion layer QDL2. In a case that white light is emitted from the light emitting element LD, the second light conversion layer QDL2 may convert incident light into light having any one of red, green, and blue colors.

The color of the light converted in the first light conversion layer QDL1 may be different from the color of the light converted in the second light conversion layer QDL2. For instance, in a case that the blue light is emitted from the light emitting element LD, the first light conversion layer QDL1 may convert the incident light into light of a red wavelength, and the second light conversion layer QDL2 may convert the incident light into light of a green wavelength.

In an embodiment, the display device 10 may comprise a light transmission layer TL that may be located or disposed in the internal space of at least one of the holes H1, H2, and H3 and may transmit the light of the first color emitted from each of the light emitting elements LD. For example, the light emitted from the light emitting element LD may pass through the light transmission layer TL. For instance, the blue light emitted from the light emitting element LD may pass through the light transmission layer TL without wavelength conversion.

The light transmission layer TL may comprise a transparent insulating material. For example, the light transmission layer TL may comprise at least one insulating material selected from the group consisting of $SiO_2$, $Si_3N_4$, $Al_2O_3$, and $TiO_2$, but it is not limited thereto. In other words, various materials having transparency may be employed.

Meanwhile, the light transmission layer TL may be omitted from the display device 10, depending on the wavelength of the light emitted from the light emitting element LD. FIG. 6 illustrates an embodiment in which the light transmission layer TL is located or disposed in the third hole H3 in a case that the light emitting element LD emits the blue light. On the other hand, in a case that the light emitting element LD emits the white light, a third light conversion layer (not illustrated) may be located or disposed in the third hole H3. In a case that the white light is emitted from the light emitting element LD, the third light conversion layer may convert incident light into light having any one of red, green, and blue colors.

Here, the colors of the light converted in the first light conversion layer QDL1, the second light conversion layer QDL2, and the third light conversion layer may be different from each other. For instance, in a case that the white light is emitted from the light emitting element LD, the first light conversion layer QDL1 may convert the incident light into the light of the red wavelength, the second light conversion layer QDL2 may convert the incident light into the light of the green wavelength, and the third light conversion layer may convert the incident light into the light of the blue wavelength. However, the colors of the light converted in the first light conversion layer QDL1, the second light conversion layer QDL2, and the third light conversion layer are not limited.

In an embodiment, the display device 10 may comprise a reflective layer RFL that may be located or disposed on an inner surface of each of the holes H1, H2, and H3 and may expose at least a portion of a region of the second end of each of the light emitting elements LD. As illustrated in FIGS. 4A, 5 and 6, the reflective layer RFL may be located or disposed on the inner surface of each of the holes H1, H2, and H3, and may be provided or disposed in the form of enclosing the light conversion layers QDL1 and QDL2 and the light transmission layer TL. Here, the reflective layer RFL may contact a portion or a region of the second end of the light emitting element LD. In other words, at least a portion or a region of the second end of the light emitting element LD may be exposed by the reflective layer RFL.

However, a connecting structure of the reflective layer RFL and the light emitting element LD is not limited thereto. For instance, as illustrated in FIG. 4B, the reflective layer RFL may be in contact with a side surface of the light emitting element LD. For example, the reflective layer RFL may be formed to extend to a side surface of the light emitting element LD. After the reflective layer RFL is formed, the light emitting element LD may be eutectic bonded to the first metal layer ML1.

A display device 10 may comprise a reflective layer RFL that may be located or disposed on the inner surface of the holes H1, H2, and H3 and may be in contact with both sides of each of the light emitting elements LD. As illustrated in FIG. 4B, the reflective layer RFL may be located or disposed on the inner surface of the hole (e.g., the first hole H1), and may be provided or disposed in the form of enclosing the light conversion layers QDL1 and QDL2, the light transmission layer TL, and the light emitting element LD. Here, the reflective layer RFL may contact the both sides of the light emitting element LD.

Different from FIGS. 9C to 9E that will be described later, after the second gate insulating film GI2 is formed on the substrate SUB having no light emitting element LD, the first hole H1 that may expose the first metal layer ML1 that may be in an area in which the light emitting elements LD may be arranged or disposed may be formed by etching the insulating layer INS, the buffer layer BFL, the first gate insulating film GI1, and the second gate insulating film GI2. Subsequently, by etching the first and second gate insulating films GI1 and GI2, a first contact hole CH1 exposing a portion or region of the semiconductor layer SCL of the transistors Ti and T2 and a second contact hole CH2 exposing another portion or region thereof may be formed, the source electrode SE coupled or electrically connected to the semiconductor layer SCL through the second contact hole CH2 may be formed on the second gate insulating film GI2, and the drain electrode DE coupled or electrically connected to the semiconductor layer SCL through the first contact hole may be formed on the second gate insulating film GI2. Thereafter, the reflective layer RFL may be formed on the inner surface of the first hole H1 and the exposed upper surface of the first metal layer ML1. The reflective layer RFL may be formed integrally with one electrode of the first transistor T1. After the reflective layer RFL located or disposed on the exposed upper surface of the first metal layer ML1 is removed, the light emitting element LD may be located or disposed on the first metal layer ML1 to be eutectic bonded thereto.

As illustrated in FIG. 4B, the reflective layer RFL may contact both side surfaces of the light emitting element LD.

The reflective layer RFL may reflect light emitted from the light emitting element LD and light converted in each of the light conversion layers QDL1 and QDL2 in a front direction (image display direction) of the display device 10. For instance, the reflective layer RFL located or disposed in the first hole H1 may reflect light changed into the second color in the first light conversion layer QDL1 to guide the light in the front direction of the display device 10. The reflective layer RFL located or disposed in the second hole H2 may reflect light changed into the second color in the second light conversion layer QDL2 to guide the light in the front direction of the display device 10. The reflective layer RFL located or disposed in the third hole H3 may reflect light of the first color emitted from the light emitting element LD and passing through the light transmission layer TL to guide the light in the front direction of the display device 10.

The reflective layer RFL may comprise a conductive material having high light reflectivity. The conductive material having the high light reflectivity may comprise metal, for example, Ag, Mg, Al, Pt, Pd, Au, Ni, Nd, Ir, Cr, Ti, and/or an alloy thereof.

The reflective layer RFL may be located or disposed in each of the holes H1, H2, and H3, thus preventing color mixing from occurring between light converted in the first light conversion layer QDL1, light converted in the second light conversion layer QDL2, and light passing through the light transmission layer TL.

In an embodiment, one electrode of the first transistor T1 and the reflective layer RFL may be integrally formed. As illustrated in FIGS. 4A to 6, the drain electrode DE of the first transistor T1 and the reflective layer RFL may be first integrally formed. Thereby, the reflective layer RFL may reflect light emitted from the light emitting element LD and light converted in the light conversion layers QDL1 and QDL2, and simultaneously may transmit the signal of the first transistor T1 to the light emitting element LD.

In an embodiment, the display device 10 may comprise a contact electrode CNT that may electrically connect the second end of each of the light emitting elements LD to the transistor (e.g., the first transistor T1). As illustrated in FIGS. 4A to 6, the contact electrode CNT may electrically connect the drain electrode DE of the first transistor T1 and the second end of the light emitting element LD. The contact electrode CNT may transmit the signal of the first transistor T1 to the light emitting element LD.

The contact electrode CNT may be located or disposed between the light conversion layers QDL1 and QDL2 and the reflective layer RFL, and between the light conversion layers QDL1 and QDL2 and the second end of each of the light emitting elements LD. In other words, the contact electrode CNT may be in contact with the outer surface of each of the light conversion layers QDL1 and QDL2, and may be provided or disposed in the form of enclosing the light conversion layers QDL1 and QDL2. For example, the contact electrode CNT may be provided or disposed in the form of enclosing side surfaces and lower surfaces of the light conversion layers QDL1 and QDL2.

As illustrated in FIG. 4A, the contact electrode CNT may enclose the side surface and the lower surface of the first light conversion layer QDL1, and may contact the reflective layer RFL and the second end of the light emitting element LD. As illustrated in FIG. 5, the contact electrode CNT may enclose a side surface and a lower surface of the second light conversion layer QDL2, and may contact the reflective layer RFL and the second end of the light emitting element LD. As illustrated in FIG. 6, the contact electrode CNT may enclose a side surface and a lower surface of the light transmission layer TL, and may contact the reflective layer RFL and the second end of the light emitting element LD.

Referring to FIGS. 2A, 2B, 4A to 6, the second end of the light emitting element LD may be electrically connected to the drain electrode DE of the first transistor T1 by the contact electrode CNT and the reflective layer RFL. The source electrode SE of the first transistor T1 may be electrically coupled or electrically connected to a power supply line to which a first driving power supply (see VDD of FIGS. 2A and 2B) may be applied. Thereby, the second end (for example, the second electrode) of the light emitting element LD may receive the signal (for example, the first driving power supply VDD) from the first transistor T1.

A first end of the light emitting element LD may contact the first metal layer ML1 to be electrically connected thereto. The first metal layer ML1 may be electrically coupled or electrically connected to a power supply line to which a second driving power supply (see VSS of FIGS. 2A and 2B) may be applied. Thereby, the first end (for example, the first electrode) of the light emitting element LD may receive the signal (for example, the second driving power supply VSS) from the first metal layer ML1.

Thus, a predetermined voltage may be applied to the first end and the second end of the light emitting element LD. If an electric field having a predetermined voltage or more is applied to the opposite ends of the light emitting element LD, the light emitting element LD may emit light while electron-hole pairs may be combined in the intermediate layer 12 of the light emitting element LD.

The contact electrode CNT may be a transparent electrode. The contact electrode CNT may comprise at least one of various transparent conductive materials, for example, ITO, IZO, and ITZO, and may be substantially transparent to satisfy a predetermined transmittance. As an example, the contact electrode CNT may be made of a transparent conductive material so that light emitted from the light emitting element LD may be transmitted without loss. However, the material of the contact electrode CNT is not limited to the above-described embodiments.

As the contact electrode CNT contacts the reflective layer RFL, the wiring resistance of the contact electrode CNT may be reduced, so that the driving failure of the light emitting element LD may be minimized due to a signal delay.

In an embodiment, the display device 10 may comprise the contact electrode CNT, the light conversion layers QDL1 and QDL2, the light transmission layer TL, the reflective layer RFL, and the encapsulation layer ENC that may cover or overlap the source electrode SE and the drain electrode DE of the transistors T1 and T2. The encapsulation layer ENC may cover or overlap the contact electrode CNT, the light conversion layers QDL1 and QDL2, the light transmission layer TL, the reflective layer RFL, and the source electrode SE and the drain electrode DE of the transistors T1 and T2 so that they may not be exposed to the outside, thus preventing the above-described components from being corroded.

The encapsulation layer ENC may comprise a transparent insulating material and thus allow light to pass therethrough. The transparent insulating material may comprise an organic material or an inorganic material. For example, the encapsulation layer ENC may be formed of a transparent insulating material to minimize the loss of light emitted from the light emitting element LD and light converted in the light conversion layers QDL1 and QDL2.

The encapsulation layer ENC may be a planarization layer that may alleviate steps caused by components arranged or disposed thereunder or there below, for example, the contact electrode CNT, the light conversion layers QDL1 and QDL2, the light transmission layer TL, the reflective layer RFL, and the source electrode SE and the drain electrode DE of the transistors T1 and T2.

In an embodiment, the display device 10 may comprise color filters CF1 and CF2 that may be located or disposed on the light conversion layers QDL1 and QDL2 and may overlap the light conversion layers QDL1 and QDL2. The color filters CF1 and CF2 may be provided or disposed on an area of the encapsulation layer ENC overlapping the light conversion layers QDL1 and QDL2.

Referring to FIGS. 4A and 5, the first color filter CF1 may be provided or disposed on the first light conversion layer QDL1, and the second color filter CF2 may be provided or disposed on the second light conversion layer QDL2. The wavelengths of the light emitted from the first and second color filters CF1 and CF2 may be different from each other. For instance, the first color filter CF1 may emit the light of the red wavelength converted from the incident light, and the second color filter CF2 may emit the light of the green wavelength converted from the incident light. However, the wavelengths of the light emitted from the first and second color filters CF1 and CF2 are not limited thereto.

As described above, in a case that the light emitting element LD emits the white light, the third light conversion layer (not illustrated) may be provided or disposed in the third hole H3. In this regard, a third color filter (not illustrated) may be located or disposed on the third light conversion layer. Here, the third color filter may emit the light of the blue wavelength converted from the incident light.

The display device 10 may comprise a black matrix BM located or disposed on the encapsulation layer ENC. The black matrix BM may be provided or disposed on a boundary between the sub-pixels SP to distinguish areas of the sub-pixels SP from each other. The black matrix BM may comprise openings that may overlap the light conversion layers QDL1 and QDL2.

As illustrated in FIGS. 4A and 5, the color filters CF1 and CF2 may be located or disposed in some or a predetermined number of the openings in the black matrix BM. The color filters CF1 and CF2 may overlap the light conversion layers QDL1 and QDL2. Referring to FIG. 6, the color filters CF1 and CF2 may not be located or disposed in the other openings in the black matrix BM.

In an embodiment, an overcoat layer OC may be provided or disposed on the black matrix BM. The overcoat layer OC may be an encapsulation layer to prevent oxygen and moisture from penetrating into the display device 10.

Figure 7:
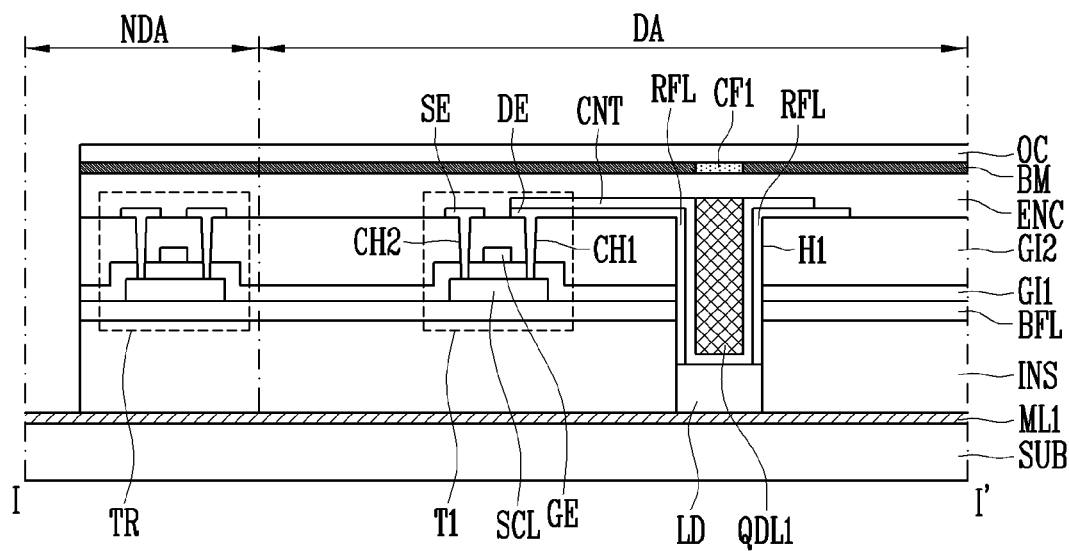
FIGS. 7 and 8 are schematic cross-sectional views illustrating various embodiments of the display device taken along line I-I' of FIG. 3.
Figure 8:
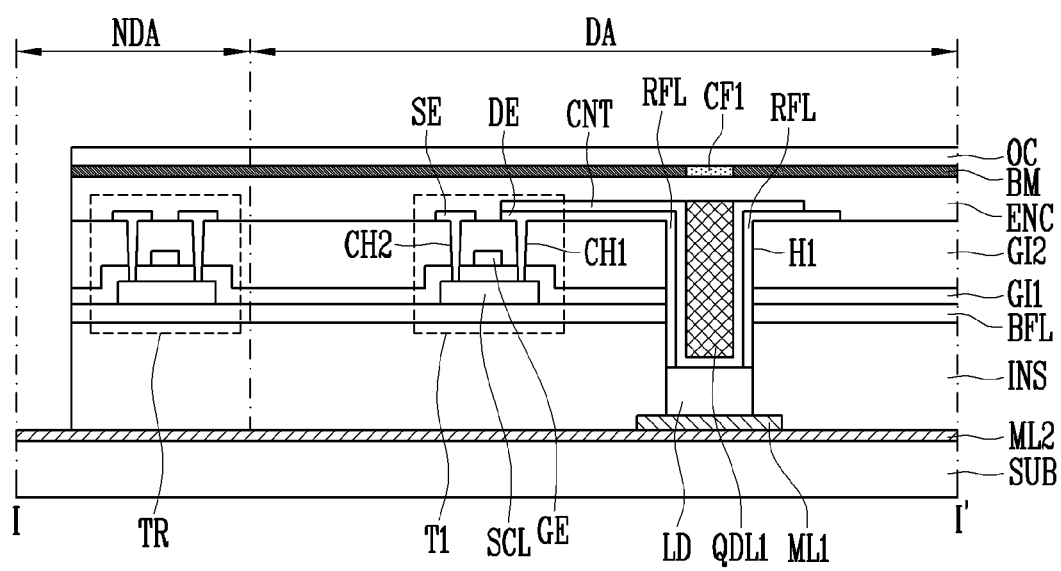

FIGS. 7 and 8 are schematic cross-sectional views illustrating various embodiments of the display device taken along line I-I' of FIG. 3. For the convenience of description, the second transistor comprised in the display device is not separately illustrated in FIGS. 7 and 8.

In order to avoid a duplicated description, components that are not mentioned in the display device according to the above-described embodiment will be mainly described. Components which are not separately explained in the following description of the embodiment comply with that of the foregoing embodiments. The same reference numeral will be used to designate the same component, and a similar reference numeral will be used to designate a similar component.

Referring to FIGS. 3 to 8, the display device 10 in accordance with an embodiment may comprise a substrate SUB, a first metal layer ML1, an insulating layer INS, light emitting elements LD, light conversion layers QDL1 and QDL2, and a light transmission layer TL.

In an embodiment, a portion or a region of an area of the first metal layer ML1 overlapping a non-display area NDA of the substrate SUB may be exposed. The non-display area NDA may comprise a driver that may drive the pixels, and a portion or a region of the line component that may couple the pixels to the driver. For instance, as illustrated in FIG. 7, the transistor TR comprised in the driver may be located or disposed on the non-display area NDA. The first metal layer ML1 may be located or disposed to extend towards the outer boundary of the substrate SUB, as compared to the transistor TR. In other words, the area of the first metal layer ML1 overlapping the non-display area NDA of the substrate SUB may comprise an area in which the insulating area INS, the buffer layer BFL, the first and second gate insulating films GI1 and GI2, the encapsulation layer ENC, the black matrix BM, and the overcoat layer OC may not be located or disposed.

As the light emitting element LD emits light, heat may be generated in the light emitting element LD. Here, the first metal layer ML1 may contact the first end of the light emitting element LD, and the heat generated in the light emitting element LD may be transmitted to the first metal layer ML1. The heat transmitted from the light emitting element LD may be released to the outside by exposing a portion or region of the first metal layer ML1, so that the heat generated from the light emitting element LD may be eliminated. Although not shown in the drawings, the exposed portion or region of the first metal layer ML1 may be coupled or connected to a cooling device, a heat dissipation layer, or a heat dissipation material located or disposed in the non-display area NDA. Thereby, the heat generated from the light emitting element LD may be effectively eliminated.

In various embodiments, the display device 10 may comprise a second metal layer ML2 located or disposed between the first metal layer ML1 and the substrate SUB. The second metal layer ML2 may contact the first metal layer ML1. The second metal layer ML2 may comprise a conductive material having high light reflectivity. The conductive material having the high light reflectivity may comprise metal, for example, Ag, Mg, Al, Pt, Pd, Au, Ni, Nd, Ir, Cr, Ti, and/or an alloy thereof.

Metals comprised in the first metal layer ML1 and the second metal layer ML2 may be different from each other. As the first metal layer ML1 and the second metal layer ML2 comprising different metals may be coupled to each other, a IR drop (voltage drop) may be prevented.

As illustrated in FIG. 8, the first metal layer ML1 may be located or disposed on an area of the second metal layer ML2 overlapping each of the light emitting elements LD. In this regard, the second metal layer ML2 may be located or disposed on the front of the substrate SUB, and a portion or region of an area of the second metal layer ML2 overlapping the non-display area NDA of the substrate SUB may be exposed. The second metal layer ML2 may comprise a metal that may be higher in heat conductivity than that of the first metal layer ML1. Thereby, heat generated from the light emitting element LD may be transmitted via the first metal layer ML1 to the second metal layer ML2, and heat may be released through the exposed portion or region of the second metal layer ML2 to the outside.

FIGS. 9A to 9K are schematic cross-sectional views sequentially illustrating a method of fabricating a display device in accordance with an embodiment. As an example, FIGS. 9A to 9K are schematic cross-sectional views sequentially illustrating the method of fabricating the display device taken along line I-I' of FIG. 3. For the convenience of description, the second transistor comprised in the display device and the transistor of the driver located or disposed in the non-display area are not separately illustrated in FIGS. 9A to 9K.

Referring to FIGS. 3 to 9A, the first metal layer ML1 may be located or disposed on the substrate SUB, and the first end of each of the light emitting elements LD emitting the light of the first color may contact the first metal layer ML1. Here, the first end of each of the light emitting elements LD may be eutectic bonded to the first metal layer ML1.

Figure 9A:
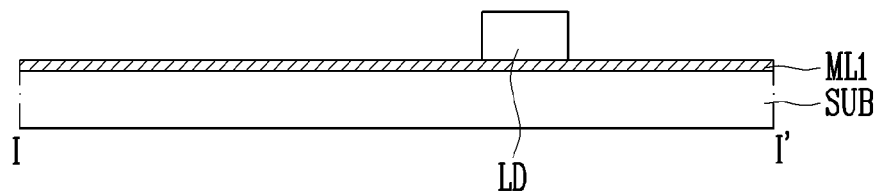
FIGS. 9A to 9K are schematic cross-sectional views sequentially illustrating a method of fabricating a display device in accordance with an embodiment.
Figure 9B:
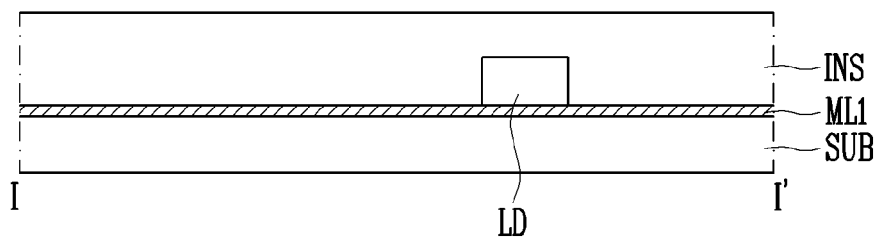

Referring to FIGS. 3 and 9B, the insulating layer INS may be formed or disposed on the first metal layer ML1 comprising the light emitting elements LD. For instance, an insulating composition may be coated on the first metal layer ML1 comprising the light emitting elements LD. The insulating composition may be cured to form the insulating layer INS. In this regard, the insulating composition may comprise polyimide resin. Thereby, the insulating layer INS may cover or overlap the light emitting element LD and the first metal layer ML1.

Figure 9C:
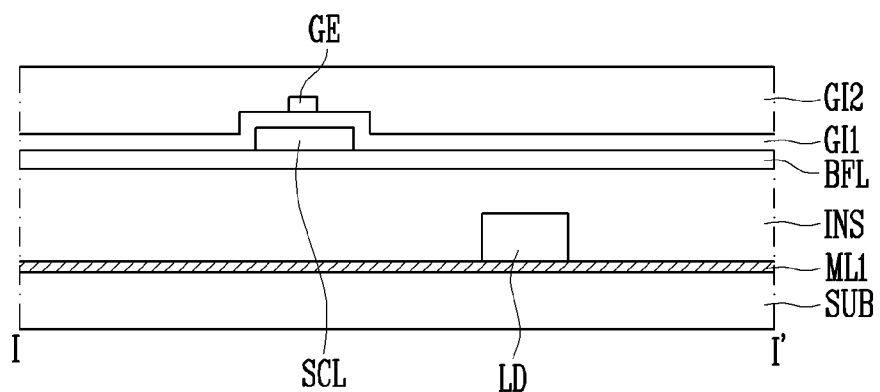

Referring to FIGS. 3 and 9C, the buffer layer BFL may be formed or disposed on the insulating layer INS, and the semiconductor layer SCL of the transistors T1 and T2 (see FIGS. 2A and 2B) may be formed or disposed on the buffer layer BFL. Subsequently, the first gate insulating film GI1 covering or overlapping the semiconductor layer SCL may be formed or disposed on the buffer layer BFL, and the gate electrode GE of the transistors T1 and T2 may be formed on the first gate insulating film GI1 to overlap the semiconductor layer SCL. Thereafter, the second gate insulating film GI2 covering or overlapping the gate electrode GE of the transistors T1 and T2 may be formed or disposed on the first gate insulating film GI1.

Figure 9D:
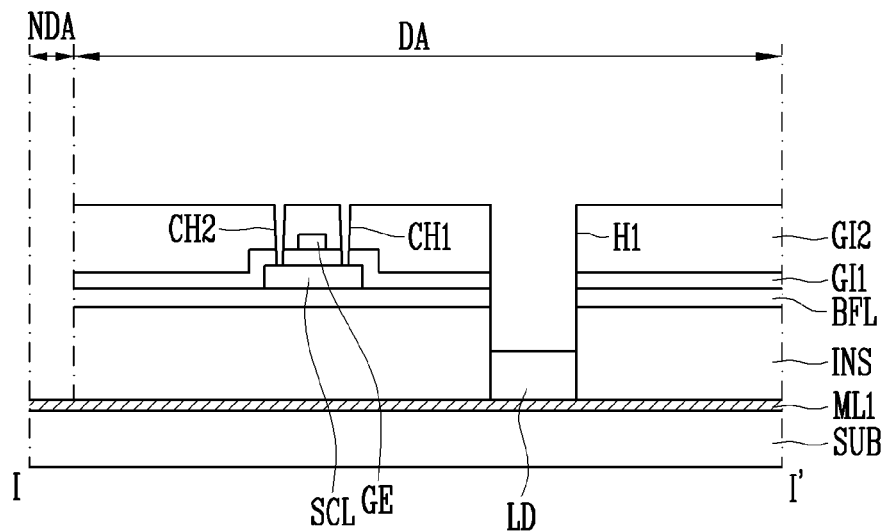

Referring to FIGS. 3 and 9D, the holes H1, H2, and H3 may be formed to expose the second end of each of the light emitting elements LD facing the first metal layer ML1, by etching a portion or region of the insulating layer INS overlapping each of the light emitting elements LD. Hereinafter, the first hole H1 will be mainly described.

In this regard, by etching the first and second gate insulating films GI1 and GI2, the first contact hole CH1 exposing a portion or region of the semiconductor layer SCL of the transistors T1 and T2 and the second contact hole CH2 exposing another portion or region thereof may be formed or disposed. By etching the first and second gate insulating films GI1 and GI2, the buffer layer BFL, and the insulating layer INS, a portion or region of the first metal layer ML1 overlapping the non-display area NDA of the substrate SUB may be exposed.

Figure 9E:
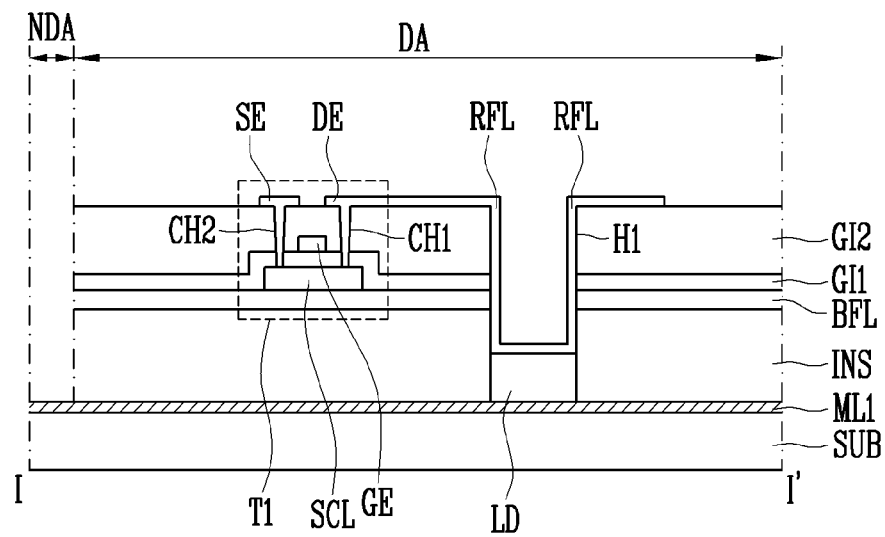

Referring to FIGS. 3 and 9E, the source electrode SE coupled or electrically connected to the semiconductor layer SCL through the second contact hole CH2 may be formed on the second gate insulating film GI2, and the drain electrode DE coupled or electrically connected to the semiconductor layer SCL through the first contact hole CH1 may be formed or disposed on the second gate insulating film GI2.

The reflective layer RFL may be formed or disposed on the inner surface of the first hole H1. Here, the reflective layer RFL may be formed integrally with an electrode of the first transistor T1. As illustrated in FIG. 9E, the reflective layer RFL may be formed integrally with the drain electrode DE of the first transistor T1. As illustrated in FIG. 9E, the reflective layer RFL may cover or overlap the second end of the light emitting element LD that may be exposed by the first hole H1.

Figure 9F:
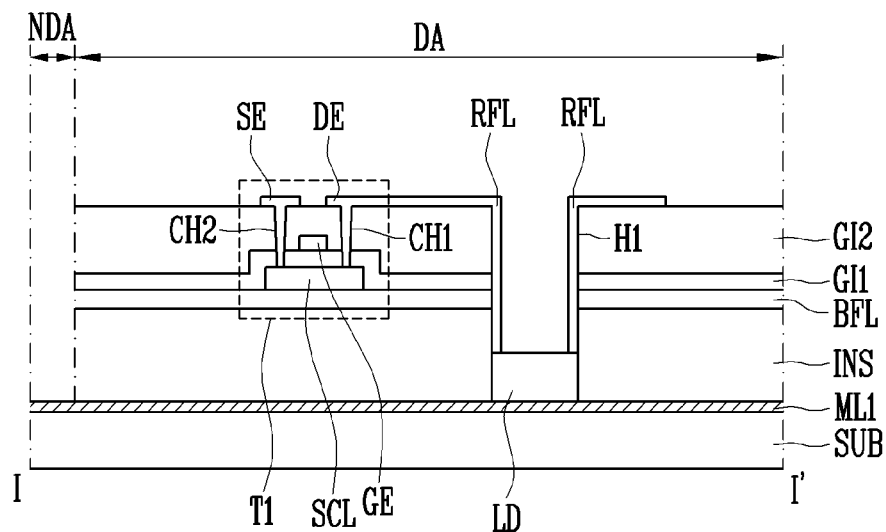

Referring to FIGS. 3 and 9F, a portion or a region of the reflective layer RFL covering or overlapping the second end of the light emitting element LD may be eliminated, except for a portion or a region of the reflective layer RFL located or disposed on the inner surface of the first hole H1, so that a portion or a region of the second end of the light emitting element LD may be exposed.

Figure 9G:
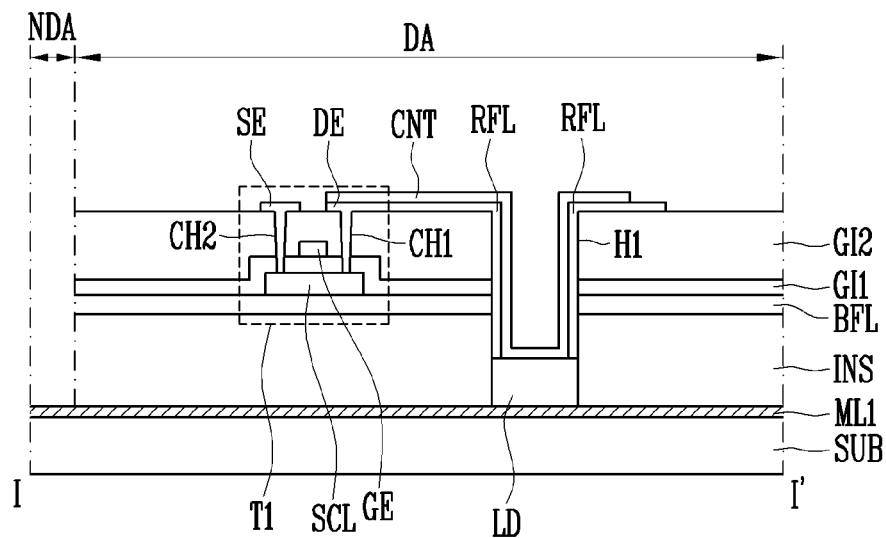

Referring to FIGS. 3 and 9G, a contact electrode CNT that may electrically connect the second end of each of the light emitting elements LD to the transistor (e.g., the first transistor T1) may be formed or disposed. As illustrated in FIG. 9G, the contact electrode CNT may be formed or disposed on the reflective layer RFL and the second end of the light emitting element LD. Thereby, the contact electrode CNT may electrically connect the drain electrode DE of the first transistor T1 and the second end of the light emitting element LD. Here, the contact electrode CNT may be formed of a transparent electrode material.

Figure 9H:
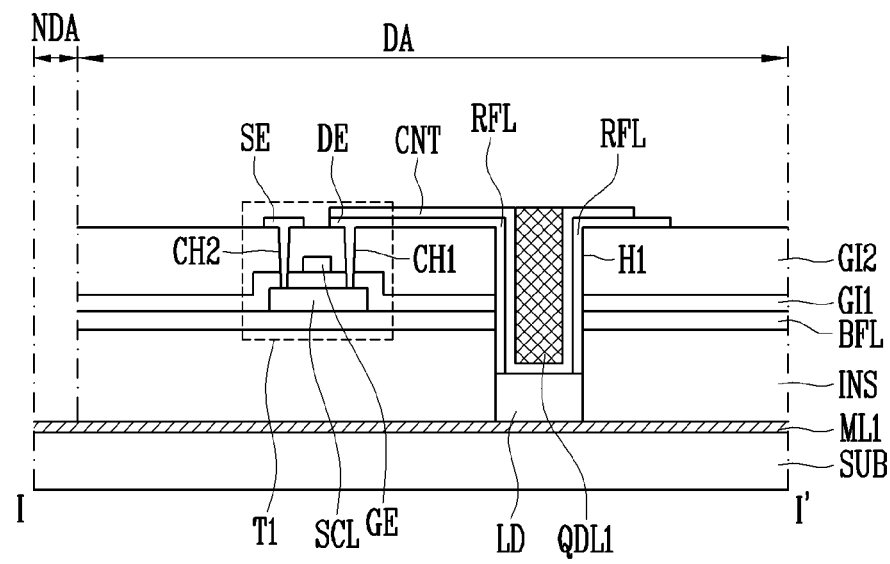

Referring to FIGS. 3 and 9H, the light conversion layers QDL1 and QDL2 overlapping the light emitting elements LD, respectively, may be formed or disposed in the internal space of at least one of the holes H1, H2, and H3. As illustrated in FIG. 9H, the first light conversion layer QDL1 may be formed or disposed on the contact electrode CNT located or disposed in the first hole H1. The second light conversion layer QDL2 may be formed or disposed on the contact electrode CNT located or disposed in the second hole H2.

In an embodiment, the light transmission layer TL may be formed or disposed in the internal space of at least one of the holes H1, H2, and H3 to transmit the light of the first color emitted from each of the light emitting elements LD. The light transmission layer TL may be formed or disposed on the contact electrode CNT located or disposed in the third hole H3.

Figure 9I:
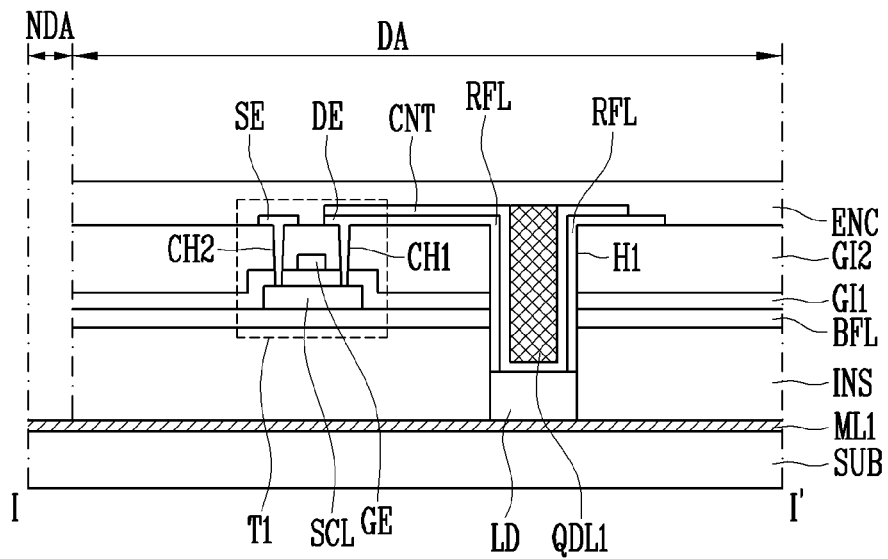
Figure 9J:
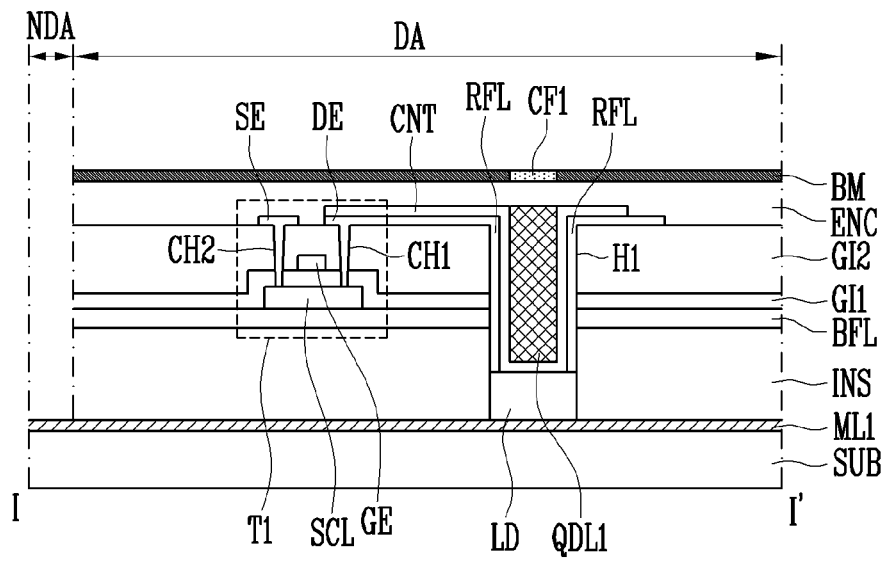

Referring to FIGS. 3, 9I and 9J, the encapsulation layer ENC covering or overlapping the source electrode SE and the drain electrode DE of the transistors Ti and T2, the contact electrode CNT, the light conversion layers QDL1 and QDL2, the light transmission layer TL, and the reflective layer RFL may be formed or disposed on the second gate insulating film GI2. The color filters CF1 and CF2 may be formed or disposed on the area of the encapsulation layer ENC overlapping the light conversion layers QDL1 and QDL2, and the black matrix BM may be formed or disposed on another area of the encapsulation layer ENC. Here, an opening of the black matrix BM may be formed or disposed on the area of the encapsulation layer ENC overlapping the light transmission layer TL.

Figure 9K:
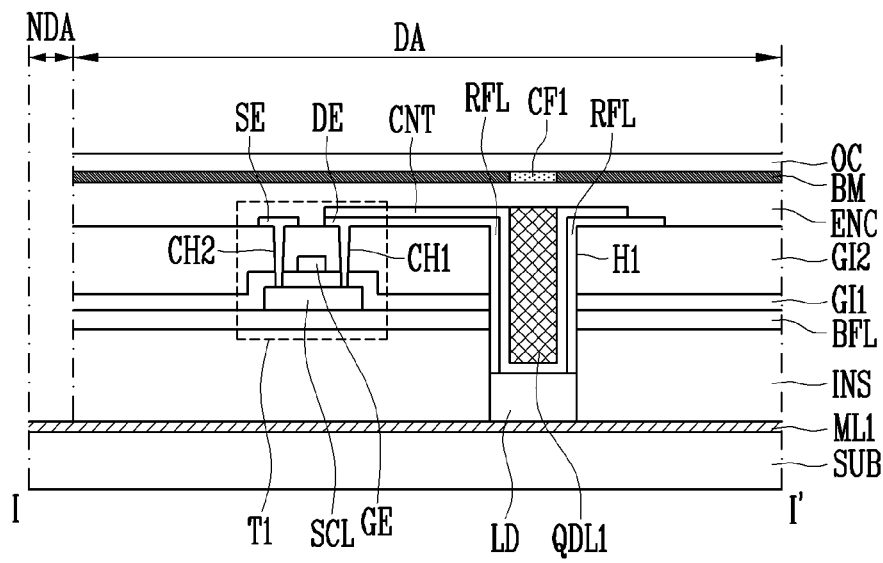

Referring to FIGS. 3 and 9K, the overcoat layer OC may be formed or disposed on the color filters CF1 and CF2 and the black matrix BM.

According to an embodiment, it may be possible to provide a display device having excellent resolution and a method of fabricating the display device.

According to an embodiment, the light emitting efficiency of light emitting elements may be improved by eutectic bonding a first end of each of the light emitting elements to a first metal layer.

According to an embodiment, the heat generating problem of light emitting elements may be solved by exposing a portion or region of a first metal layer that may be in contact with the light emitting elements.

However, effects of the disclosure are not limited to the above-described effects, and various modifications are possible without departing from the spirit and scope of the disclosure.

The foregoing detailed descriptions may illustrate and describe the disclosure. In addition, the foregoing descriptions merely illustrate and describe embodiments. As described above, the disclosure may be used in various different combinations, modifications and environments, and may be changed or modified within the scope of the disclosure disclosed in this specification, the scope equivalent to the above-described description and/or the scope of technology or knowledge of the art. Therefore, the description is not intended to limit the disclosure to the form disclosed herein. Also, it is intended that the appended claims be construed to comprise alternative embodiments.

What is claimed is:

1. A display device, comprising:
    a substrate;
    a first metal layer disposed on the substrate;
    light emitting elements separated from one another and emitting light of a first color, each of the light emitting elements having a first end electrically contacting the first metal layer and a second end facing away from the first metal layer;
    an insulating layer disposed on the first metal layer and comprising holes exposing the second end of each of the light emitting elements;
    a light conversion layer disposed in at least one of the holes and overlapping the light emitting elements; and
    a reflective later disposed on an inner surface of each of the holes and exposing at least a portion of the second end of each of the light emitting elements,
    wherein the light conversion layer converts the light of the first color emitted from the light emitting elements into light of a second color.

2. The display device according to claim 1, wherein the reflective layer contacts a side surface of each of the light emitting elements.

3. The display device according to claim 1, further comprising:
    a transistor disposed on the insulating layer and electrically connected to each of the light emitting elements.

4. The display device according to claim 3, wherein an electrode of the transistor and the reflective layer are integral with each other.

5. The display device according to claim 3, further comprising:
    a contact electrode electrically connecting the second end of each of the light emitting elements with the transistor.

6. The display device according to claim 5, wherein the contact electrode is disposed between the light conversion layer and the reflective layer, and disposed between the light conversion layer and the second end of each of the light emitting elements.

7. The display device according to claim 5, wherein the contact electrode is a transparent electrode.

8. The display device according to claim 1, further comprising:
    a color filter disposed on the light conversion layer and overlapping the light conversion layer.

9. The display device according to claim 1, further comprising:
    a light transmission layer disposed in the at least one of the holes and transmitting the light of the first color emitted from each of the light emitting elements.

10. The display device according to claim 1, wherein the substrate comprises a display area and a non-display area adjacent to the display area, and
    a portion of the first metal layer overlapping the non-display area is exposed as a heat dissipation layer.

11. The display device according to claim 1, further comprising:
    a second metal layer disposed between the first metal layer and the substrate.

12. The display device according to claim 11, wherein the first metal layer is disposed on a portion of the second metal layer overlapping each of the light emitting elements.

13. The display device according to claim 1, wherein the first end of each of the light emitting elements and the first metal layer are eutectic bonded to each other.

14. A method of fabricating a display device, comprising:
    contacting a first end of each of light emitting elements emitting light of a first color with a first metal layer disposed on a substrate;
    forming an insulating layer overlapping the light emitting elements and the first metal layer;
    etching a portion of the insulating layer overlapping the light emitting elements to form holes exposing a second end of each of the light emitting elements facing away from the first metal layer; and
    forming a light conversion layer overlapping each of the light emitting elements in at least one of the holes, wherein the light conversion layer converts the light of the first color emitted from the light emitting elements into light of a second color.

15. The method according to claim 14, wherein the contacting of the first end of each of the light emitting elements comprises:
eutectic bonding the first end of each of the light emitting elements to the first metal layer.

16. The method according to claim 14, further comprising:
forming a reflective layer on an inner surface of each of the holes.

17. The method according to claim 16, further comprising:
forming a transistor electrically connected to each of the light emitting elements on the insulating layer, and
integrally forming an electrode of the transistor and the reflective layer.

18. The method according to claim 14, further comprising:
forming a light transmission layer in the at least one of the holes, the light transmission layer transmitting the light of the first color emitted from each of the light emitting elements.

19. The method according to claim 17, further comprising:
forming a contact electrode electrically connecting the second end of each of the light emitting elements with the transistor.

20. A display device, comprising:
a substrate;
a first metal layer disposed on the substrate;
light emitting elements separated from one another and emitting light of a first color, each of the light emitting elements having a first end electrically contacting the first metal layer and a second end facing away from the first metal layer;
an insulating layer disposed on the first metal layer and comprising holes exposing the second end of each of the light emitting elements; and
a light conversion layer disposed in at least one of the holes and overlapping the light emitting elements,
wherein the light conversion layer converts the light of the first color emitted from the light emitting elements into light of a second color,
wherein the substrate comprises a display area and a non-display area adjacent to the display area, and
wherein a portion of the first metal layer overlapping the non-display area is exposed as a heat dissipation layer.

21. A display device, comprising:
a substrate;
a first metal layer disposed on the substrate;
light emitting elements separated from one another and emitting light of a first color, each of the light emitting elements having a first end electrically contacting the first metal layer and a second end facing away from the first metal layer;
an insulating layer disposed on the first metal layer and comprising holes exposing the second end of each of the light emitting elements;
a light conversion layer disposed in at least one of the holes and overlapping the light emitting elements; and
a second metal layer disposed between the first metal layer and the substrate,
wherein the light conversion layer converts the light of the first color emitted from the light emitting elements into light of a second color, and
wherein the first metal layer is disposed on a portion of the second metal layer overlapping each of the light emitting elements.

* * * * *